(12) United States Patent
Lee

(10) Patent No.: US 6,238,987 B1
(45) Date of Patent: May 29, 2001

(54) METHOD TO REDUCE PARASITIC CAPACITANCE

(75) Inventor: Claymens Lee, Kaohsiung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/394,636

(22) Filed: Sep. 13, 1999

(51) Int. Cl.[7] .................................................. H01L 21/336
(52) U.S. Cl. .......................... 438/305; 438/422; 438/595
(58) Field of Search .................................... 438/305, 306, 438/307, 411, 421, 422, 595, 619, 633

(56) References Cited

U.S. PATENT DOCUMENTS

| | | | |
|---|---|---|---|
| 5,661,049 | * 8/1997 | Lur et al. | 438/422 |
| 5,736,446 | * 4/1998 | Wu | 438/305 |
| 5,915,182 | * 6/1999 | Wu | 438/305 |
| 5,972,761 | * 10/1999 | Wu | 438/595 |

* cited by examiner

Primary Examiner—Chandra Chaudhari
(74) Attorney, Agent, or Firm—Charles C.H. Wu; Charles C.H. Wu & Associates

(57) ABSTRACT

A method to lower the parasitic capacitance is described, in which a low dielectric constant air-gap is formed in the dielectric layers at both sides of the gate to lower the parasitic capacitance present between the gate and the source/drain region. The air-gap is formed by forming spacers at both sides of the gate, followed by forming a first dielectric layer with its height lower than the top of the spacers. Thereafter, the spacers are removed by wet etching to form a hole with its top narrower than its bottom. A second dielectric layer is further formed, by a deposition technique with a weaker step coverage capability, to encapsulate the hole and to cover the substrate, wherein the encapsulated hole is the air-gap.

20 Claims, 2 Drawing Sheets

METHOD TO REDUCE PARASITIC CAPACITANCE

BACKGROUND OF THE INVENTION

1. Field of the Invention

This invention relates to a fabrication method for an integrated circuit. More particularly, the invention relates to a fabrication method for a metal-oxide-semiconductor field-effect transistor (MOSFET).

2. Description of the Related Art

In the current fabrication of an integrated circuit, a dielectric layer is formed as a device isolation structure to cover the substrate and the transistor after the completion of the manufacturing of the transistor. A consequence of having multiple layers of conductive structure separated by a dielectric material, however, is the formation of a parasitic capacitor between the transistor gate and the source/drain region. The parasitic capacitance between the conductive material separated by the insulating material in microelectronic devices contributes to effects such as the RC delay time and a decrease of the device operating speed.

The capacitance of the parasitic capacitor is related to the dielectric material used between the gate and the source/drain region. The dielectric material between the gate and the source/drain region is normally the material used for the dielectric layer and the spacer to isolate devices. The material for the dielectric layer is typically silicon dioxide ($SiO_2$), and for the spacer it is normally silicon dioxide or silicon nitride ($Si_3N_4$). The dielectric constant for these two types of materials are very high (silicon oxide is 3.9, and silicon nitride is 7.0). As a result, the parasitic capacitance presents between the gate electrode and the source/drain region is very high and the device operating speed is adversely affected.

SUMMARY OF THE INVENTION

In the light of the foregoing, the present invention provides a method to lower the parasitic capacitance, which can effectively lower the parasitic capacitance present between the transistor gate and the source/drain region. The RC time delay thereby is decreased and the operating speed of the device is increased.

The present invention provides a method to lower the parasitic capacitance by forming a low dielectric constant air-gap in the dielectric layer at the two sides of the gate. The method in forming the air-gap includes providing a semiconductor substrate with a gate oxide layer. A gate is then formed on the gate oxide layer. A lightly doped drain region is also formed in the substrate at the two sides of the gate. Thereafter, a conformal liner oxide layer is formed on the substrate, followed by forming spacers right next to the liner oxide layer at the two sides of the gate. The spacers are, for example, silicon nitride. A source/drain region connected to the lightly doped drain region is formed in the substrate outside of the spacers. A first dielectric layer is further formed on the substrate, wherein the height of the first dielectric layer is slightly lower than the top of the spacers, thereby partially exposing the surface of the spacers. The spacers are removed by wet etching to form a hole between the gate and the dielectric layer, with the top of the hole narrower than the bottom of the hole. After which, a second dielectric layer is formed by thin film deposition with a weaker step coverage capability to encapsulate the hole and to cover the substrate. In this step, although a part of the second dielectric layer fills the hole, the hole is not completely packed by the second dielectric layer. As a result, the second dielectric layer formed contains an air-gap.

The air-gaps formed in the above method are filled with air. Since the dielectric constant of air is very low (about 1), the dielectric constant of the dielectric material between the gate and the source/drain region is thereby decreased to effectively reduce the parasitic capacitance.

A main feature of the present invention is an air-gap similar to a spacer is formed at the two sides of the gate, taking the advantage of the low dielectric constant of air to lower the parasitic capacitance between the gate and the source/drain region.

Another feature of the present invention is to form a first dielectric layer having a height slightly lower than the top of the spacers. The spacers are then removed to form a hole. A thin film deposition with a poor step coverage capability is further conducted to form the second dielectric layer encapsulating the hole but not densely packing the hole. An air-gap similar to a spacer is therefore formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
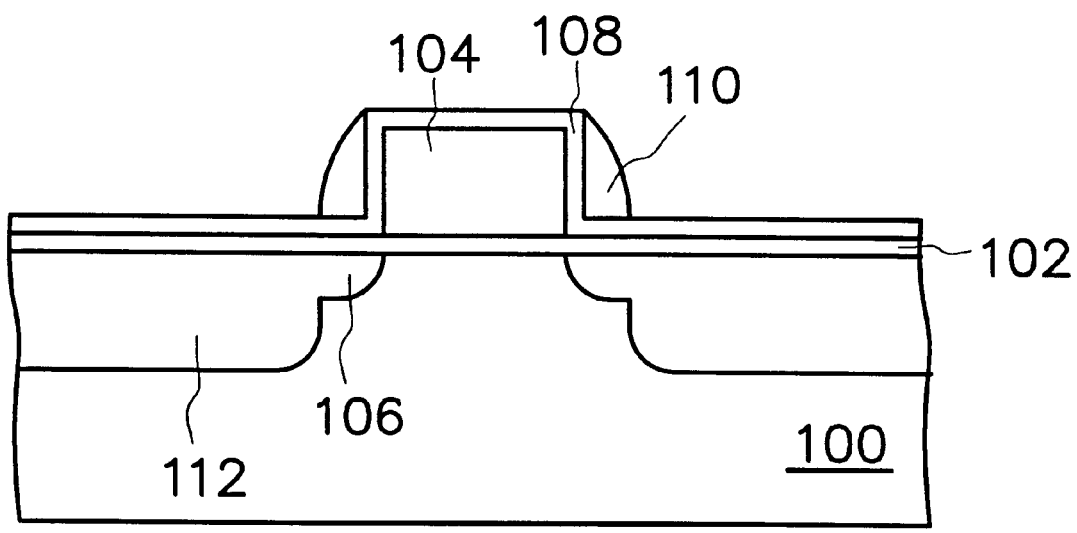
FIGS. 1A to 1D are schematic, cross-sectional views showing the method to lower the parasitic capacitance according to the preferred embodiment of the present invention.

Referring to FIG. 1A, a gate oxide layer 102 is formed on a semiconductor substrate 100, and a gate 104 is formed on the gate oxide layer 102. The gate 104 is formed by, for example, forming a layer of polysilicon to cover the gate oxide layer 102, followed by defining the polysilicon layer by means of photolithography and etching to form the gate 104. A lightly doped drain region 106 is formed in the substrate 100 at the two sides of the gate 104. Thereafter, a conformal liner oxide layer 108 is formed on the substrate 100, followed by forming spacers 110 next to the outside of the liner oxide layer 108 at the two sides of the gate 104. The spacers 110 are formed by, for example, forming a silicon nitride layer to cover the substrate 100, followed by an etching back process. A source/drain region 112 is then formed in the substrate 100 outside of the spacers 110. Although in the current preferred embodiment, the present invention is described with respect to a spacer with its top narrower than its bottom, the invention is also applicable to a spacer with its top having the same width as its bottom or to a spacer with its top broader than its bottom.

Figure 1B:
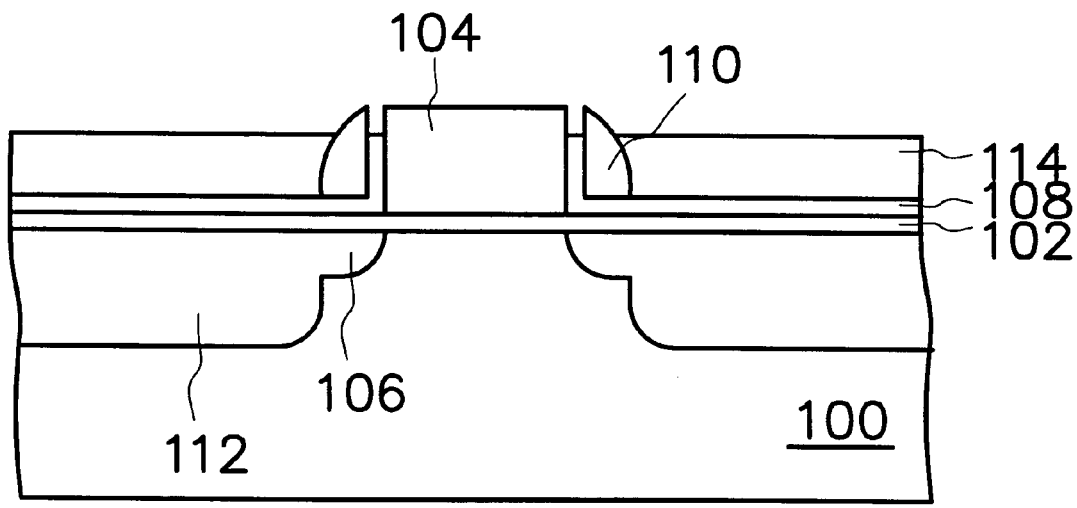

As shown in FIG. 1B, a first dielectric layer 114 is formed on the substrate 100, wherein the surface of the first dielectric layer 114 is slightly lower than the top of the spacer 110, exposing a portion of the spacer 110. The first dielectric layer 114 is formed by, for example, depositing a layer of silicon oxide of approximately 5000 Å to 8000 Å thick to cover the substrate, followed by chemical mechanical polishing (CMP) the silicon oxide layer. The CMP process terminates at above the gate and the spacer. An etch back of the silicon oxide layer is further conducted until its surface is about 400 Å to about 500 Å lower than the top part of the spacer 110. In this process, materials used for the gate 104 and the spacers 110 are different from that for the first dielectric layer 114, the gate 104 and the spacers 110 are thus prevented from being damaged during the chemical mechanical polishing process. The portion of the liner oxide layer 108, located on the gate 104, is removed because materials used for the liner oxide layer 108 is similar material to those for the first dielectric layer 114. The thickness of the first dielectric layer 114 is controlled by regulating the duration of the chemical mechanical polishing process and the etch back process.

Figure 1C:
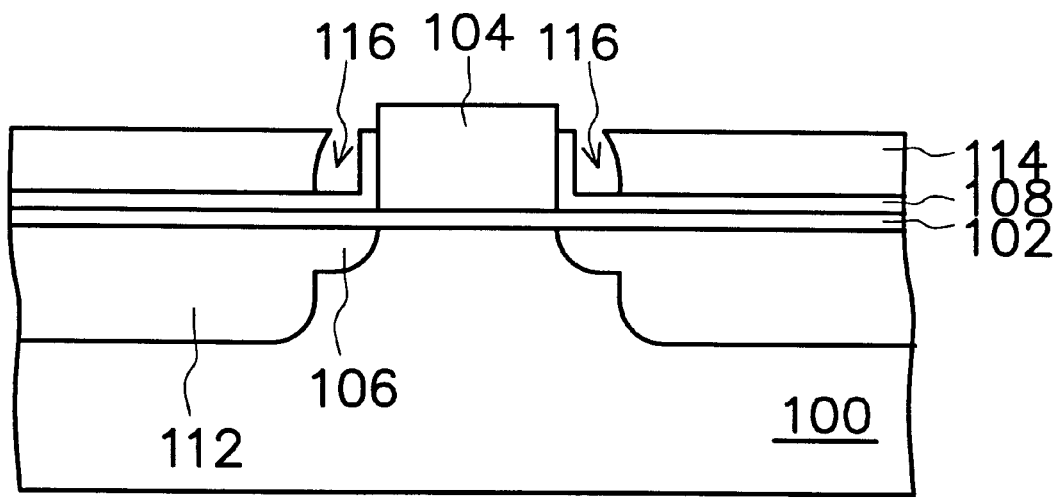

Referring to FIG. 1C, the spacers 110 are removed to form a hole 116 between the gate 104 and the first dielectric layer 114. The hole illustrated in the Figure is narrower at the top and is broader at the bottom. The spacers 110 are removed, for example, by wet etching. In this spacer removal process, the material of the spacer 110 is different from those used for the first dielectric layer 114 and the liner oxide layer 108. After the spacers 110 are removed to form the hole 116, the original thickness and shape of the first dielectric layer 114 and the liner oxide layer 108 are retained.

Figure 1D:
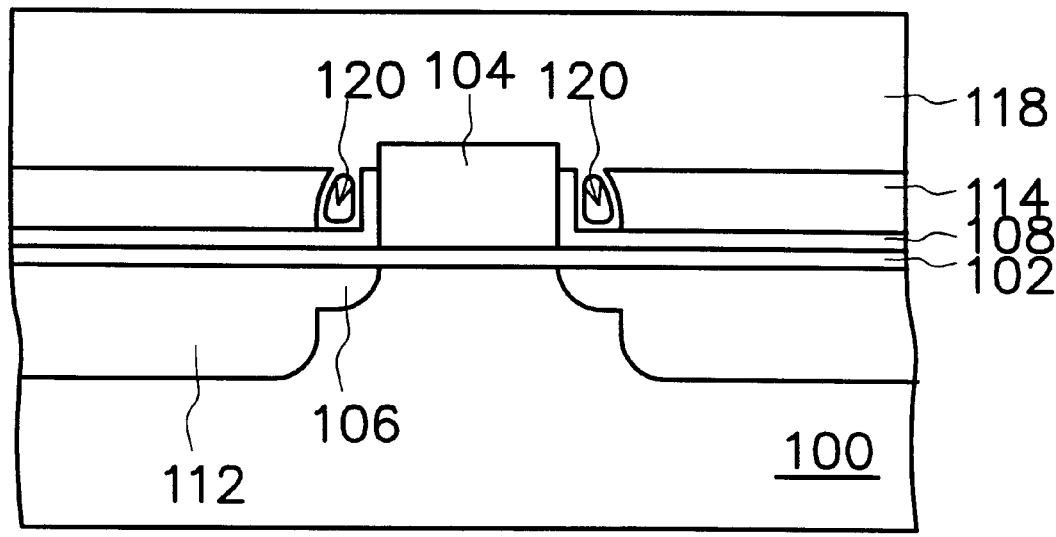

Referring to FIG. 1D, a second dielectric layer 118 is formed to cover the substrate 100, encapsulating the hole 116 (as illustrated in FIG. 1C), but not completely packing the hole. Based on this requirement, the second dielectric layer 118 is formed by using a thin film deposition technique with a weaker step coverage capability, for example, by means of plasma enhanced chemical vapor deposition (PECVD) to deposit a layer of silicon oxide.

In this process, because the top of the hole 116 is narrower than the bottom of he hole, an air-gap 120 is formed in hole 116 even after encapsulating the hole 116 with the second dielectric layer 118. Thus, during the formation of the first dielectric layer 114, it is very important to control the height of the first dielectric layer 114, and is essential to coordinate with the capability of the step coverage technique in forming the second dielectric layer 118. The second dielectric layer 118 thereby encapsulates the hole 116 without densely packing the hole 116 to achieve the purpose of forming an air-gap 120.

Based on the foregoing, a main feature of the present invention is to form an air-gap, similar to a spacer, using the characteristic of the low dielectric constant of air to lower the parasitic capacitance between the gate and the source/drain region.

Another feature of the present invention is to form a first dielectric layer with the height of its surface slightly lower than the top of the spacers. The spacers are removed. A second dielectric layer is further formed using a thin film deposition with a weaker step coverage capability to encapsulate the hole with the second dielectric layer without densely packing the hole with the second dielectric layer. As a result, an air-gap similar to a spacer is formed.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method to lower the parasitic capacitance, the method comprising the steps of:

forming a gate oxide layer on a substrate;

forming a gate on the gate oxide layer;

forming a plurality of spacers at both sides of the gate;

forming a first dielectric layer on the substrate, wherein by chemical mechanical polishing a surface of the first dielectric layer, the polished surface of the first dielectric layer is lower than a top of the spacer;

removing the spacers to form a plurality of holes between the gate and the first dielectric layer; and encapsulating the holes to form a plurality of air-gaps between the gate and the first dielectric layer.

2. The method to lower the parasitic capacitance according to claim 1, wherein the spacer includes silicon nitride.

3. The method to lower the parasitic capacitance according to claim 2, wherein the method further includes forming a conformal liner oxide layer on the substrate before the formation of these spacers.

4. The method to lower the parasitic capacitance according to claim 1, wherein forming the first dielectric layer includes:

forming an oxide material to cover the substrate;

chemical mechanical polishing the oxide material terminating on a surface of the oxide material;

back etching the oxide material until the surface of the oxide material is lower than a top of the spacers.

5. The method to lower the parasitic capacitance according to claim 4, wherein an end-point of chemical mechanical polishing of the oxide material is time controlled.

6. The method to lower the parasitic capacitance according to claim 4, wherein heights of the first dielectric layer and the top of the spacers are differed by about 400 Å to about 500 Å.

7. The method to lower the parasitic capacitance according to claim 1, wherein the spacers are removed by wet etching.

8. The method to lower the parasitic capacitance according to claim 1, wherein encapsulating the hole includes forming a second dielectric layer on the substrate to fill but not densely pack the hole.

9. The method to lower the parasitic capacitance according to claim 1, wherein a formation of the second dielectric layer includes a thin film deposition technique with a weaker step coverage capability.

10. The method to lower the parasitic capacitance according to claim 1, wherein the formation of the second dielectric layer includes plasma enhanced chemical vapor deposition.

11. The method to lower the parasitic capacitance according to claim 1, wherein the method further includes forming a lightly doped drain region in the substrate by two sides of the gate before forming the spacers.

12. The method to lower the parasitic capacitance according to claim 11, wherein the method further includes forming a source/drain region in the substrate at an outside of the spacers with the source/drain region and the lightly doped drain connected together.

13. A method to form an air-gap in a dielectric layer, which is applicable to a manufacturing of a metal-oxide-semiconductor field-effect transistor, the method comprising the steps of:

forming a gate in a substrate;

forming a plurality of spacers at both sides of the gate;

forming a first dielectric layer on the substrate, wherein by chemical mechanical polishing a surface of the first dielectric layer the polished surface of the first dielectric layer is formed lower than an upper part of the spacers;

removing the spacers to form a plurality of holes between the gate and the first dielectric layer; and forming a second dielectric layer on the substrate to encapsulate the holes, wherein the second dielectric layer does not densely pack the holes.

14. The method to form an air-gap in a dielectric layer, which is applicable to a manufacturing of a metal-oxide-semiconductor field-effect transistor according to claim 13, wherein the method further includes forming a conformal liner oxide layer on the substrate before the formation of the spacers.

15. The method to form an air-gap in a dielectric layer, which is applicable to a manufacturing of a metal-oxide-semiconductor field-effect transistor according to claim 13, wherein the spacers are removed by wet etching.

16. The method to form an air-gap in a dielectric layer, which is applicable to a manufacturing of a metal oxide semiconductor field-effect transistor according to claim 13, wherein forming the second dielectric layer includes performing a thin film deposition with a weaker step coverage capability.

17. The method to form an air-gap in a dielectric layer, which is applicable to a manufacturing of a metal-oxide-semiconductor field-effect transistor according to claim 13, wherein forming the second dielectric layer includes performing plasma enhanced chemical vapor deposition.

18. The method to form an air-gap in a dielectric layer, which is applicable to a manufacturing of a metal-oxide-semiconductor field-effect transistor according to claim 13, wherein forming the first dielectric layer includes:

forming an oxide material to cover the substrate; and chemical mechanical polishing the oxide material until a surface of the oxide material is lower than an top part of the spacers.

19. The method to form an air-gap in a dielectric layer, which is applicable to a manufacturing of a metal-oxide-semiconductor field-effect transistor according to claim 18, wherein a polishing end-point of chemical mechanical polishing of the oxide material is time controlled.

20. The method to form an air-gap in a dielectric layer, which is applicable to a manufacturing of a metal-oxide-semiconductor field-effect transistor according to claim 18, wherein heights of a surface of the first dielectric layer and the top of the spacers are differed by about 400 Å to about 500 Å.

* * * * *